(12) United States Patent
Sadjadi et al.

(10) Patent No.: US 7,682,516 B2
(45) Date of Patent: *Mar. 23, 2010

(54) VERTICAL PROFILE FIXING

(75) Inventors: S. M. Reza Sadjadi, Saratoga, CA (US);
Peter Cirigliano, Sunnyvale, CA (US);
Jisoo Kim, Pleasanton, CA (US);
Zhisong Huang, Fremont, CA (US);
Eric A. Hudson, Berkeley, CA (US)

(73) Assignee: Lam Research Corporation, Fremont, CA (US)

( * ) Notice: Subject to any disclaimer, the term of this patent is extended or adjusted under 35 U.S.C. 154(b) by 303 days.

This patent is subject to a terminal disclaimer.

(21) Appl. No.: 11/244,870

(22) Filed: Oct. 5, 2005

(65) Prior Publication Data
US 2007/0075038 A1    Apr. 5, 2007

(51) Int. Cl.
*H01L 21/302*    (2006.01)
(52) U.S. Cl. ............ 216/41; 216/46; 216/47; 216/49; 216/67; 438/694; 438/702; 438/703; 438/710; 438/719; 438/734
(58) Field of Classification Search ............ 216/41
See application file for complete search history.

(56) References Cited

U.S. PATENT DOCUMENTS

| 5,342,481 A * | 8/1994 | Kadomura ............ 216/46 |
| 6,103,596 A * | 8/2000 | Peng ............ 438/439 |
| 6,121,154 A * | 9/2000 | Haselden et al. ............ 438/724 |
| 6,217,786 B1 * | 4/2001 | Hills et al. ............ 216/79 |
| 6,617,253 B1 * | 9/2003 | Chu et al. ............ 438/702 |
| 7,241,683 B2 * | 7/2007 | Hudson et al. ............ 438/637 |
| 7,250,371 B2 * | 7/2007 | Kang et al. ............ 438/696 |
| 7,271,107 B2 * | 9/2007 | Marks et al. ............ 438/717 |
| 7,271,108 B2 * | 9/2007 | Sadjadi ............ 438/717 |
| 7,273,815 B2 * | 9/2007 | Sadjadi et al. ............ 438/689 |
| 7,294,580 B2 * | 11/2007 | Yun et al. ............ 438/710 |
| 2001/0045527 A1 * | 11/2001 | Wissman et al. ............ 250/492.2 |
| 2003/0235998 A1 * | 12/2003 | Liang ............ 438/758 |

(Continued)

FOREIGN PATENT DOCUMENTS

SG    144148    7/2008

(Continued)

OTHER PUBLICATIONS

International Search Report dated Jun. 14, 2007 from corresponding International application No. PCT/US2006/038299.

(Continued)

*Primary Examiner*—Anita K Alanko
(74) *Attorney, Agent, or Firm*—Beyer Law Group LLP

(57) ABSTRACT

A method for etching features in an etch layer is provided. A patterned photoresist mask is formed over the etch layer with photoresist features with sidewalls wherein the sidewalls of the photoresist features have irregular profiles along depths of the photoresist features. The irregular profiles along the depths of the photoresist features of the sidewalls of the photoresist features are corrected comprising at least one cycle, where each cycle comprises a sidewall deposition phase and a profile shaping phase. Feature is etched into the etch layer through the photoresist features. The mask is removed.

20 Claims, 10 Drawing Sheets

U.S. PATENT DOCUMENTS

| | | | |
|---|---|---|---|
| 2004/0038536 A1* | 2/2004 | Zhang et al. | 438/694 |
| 2004/0072430 A1* | 4/2004 | Huang et al. | 438/689 |
| 2004/0101786 A1* | 5/2004 | Meagley | 430/322 |
| 2005/0048785 A1* | 3/2005 | Kang et al. | 438/696 |
| 2006/0134917 A1* | 6/2006 | Huang et al. | 438/694 |
| 2006/0194439 A1* | 8/2006 | Sadjadi et al. | 438/725 |
| 2006/0266478 A1* | 11/2006 | Lee et al. | 156/345.24 |
| 2007/0004217 A1* | 1/2007 | Charatan | 438/736 |
| 2007/0123016 A1* | 5/2007 | Sadjadi et al. | 438/597 |
| 2007/0123053 A1* | 5/2007 | Kim et al. | 438/736 |
| 2007/0193973 A1* | 8/2007 | Kim et al. | 216/41 |
| 2007/0264830 A1* | 11/2007 | Huang et al. | 438/694 |
| 2007/0293050 A1* | 12/2007 | Kang et al. | 438/696 |

FOREIGN PATENT DOCUMENTS

| | | |
|---|---|---|
| WO | WO 99/33095 | 7/1999 |
| WO | WO 2006/065630 A | 6/2006 |
| WO | WO 2006/083592 A | 8/2006 |
| WO | WO 2006/096528 A2 | 9/2006 |

OTHER PUBLICATIONS

Written Opinion dated Jun. 14, 2007 from corresponding International Application No. PCT/US2006/038299.

Search Report dated Jun. 29, 2009 from Singapore Patent Application No. 200802563-7.

Written Opinion dated Jun. 29, 2009 from Singapore Patent Application No. 200802563-7.

* cited by examiner

VERTICAL PROFILE FIXING

BACKGROUND OF THE INVENTION

The present invention relates to the formation of semiconductor devices.

During semiconductor wafer processing, features of the semiconductor device are defined in the wafer using well-known patterning and etching processes. In these processes, a photoresist (PR) material is deposited on the wafer and then is exposed to light filtered by a reticle. The reticle is generally a glass plate that is patterned with exemplary feature geometries that block light from propagating through the reticle.

After passing through the reticle, the light contacts the surface of the photoresist material. The light changes the chemical composition of the photoresist material such that a developer can remove a portion of the photoresist material. In the case of positive photoresist materials, the exposed regions are removed, and in the case of negative photoresist materials, the unexposed regions are removed. Thereafter, the wafer is etched to remove the underlying material from the areas that are no longer protected by the photoresist material, and thereby define the desired features in the wafer.

Such processes may cause mask features to have irregular vertical profiles.

SUMMARY OF THE INVENTION

To achieve the foregoing and in accordance with the purpose of the present invention a method for etching features in an etch layer is provided. A patterned photoresist mask is formed over the etch layer with photoresist features with sidewalls wherein the sidewalls of the photoresist features have irregular profiles along depths of the photoresist features. The irregular profiles along the depths of the photoresist features of the sidewalls of the photoresist features are corrected comprising at least one cycle, where each cycle comprises a sidewall deposition phase and a profile shaping phase. Features are etched into the etch layer through the photoresist features. The mask is removed.

In another manifestation of the invention a method for etching features with vertical profile sidewalls in an etch layer is provided. A patterned photoresist mask is formed over the etch layer with photoresist features with sidewalls wherein the sidewalls of the photoresist features have non-vertical profile sidewalls. The non-vertical profile sidewalls are corrected to form photoresist features with vertical profile sidewalls comprising a plurality of cycles, wherein each cycle comprises a sidewall deposition phase and a profile shaping phase. Features are etched with vertical profile sidewalls into the etch layer through the photoresist features. The mask is removed.

In another manifestation of the invention an apparatus for etching features in an etch layer, below a photoresist mask with photoresist features with irregular profiles along depths of the photoresist features is provided. A plasma processing chamber is provided, comprising a chamber wall forming a plasma processing chamber enclosure, a substrate support for supporting a substrate within the plasma processing chamber enclosure, a pressure regulator for regulating the pressure in the plasma processing chamber enclosure, at least one electrode for providing power to the plasma processing chamber enclosure for sustaining a plasma, a gas inlet for providing gas into the plasma processing chamber enclosure, and a gas outlet for exhausting gas from the plasma processing chamber enclosure. A gas source is in fluid connection with the gas inlet, where the gas source comprises a photoresist feature sidewall deposition gas source, a profile shaping gas source, and an etch layer etch gas source. A controller is controllably connected to the gas source and the at least one electrode, comprising at least one processor and computer readable media. The computer readable media comprises computer readable code for correcting the irregular profiles, comprising a plurality of cycles, wherein each cycle comprises computer readable code for providing a deposition gas from the deposition gas source, computer readable code for generating a plasma from the deposition gas, computer readable code for stopping the deposition gas from the deposition gas source, computer readable code for providing a profile shaping gas from the profile shaping gas source, computer readable code for generating a plasma from the profile shaping gas, and computer readable code for stopping the profile shaping gas from the profile shaping gas source. The computer readable media further comprises computer readable code for etching the etch layer and computer readable code for removing the photoresist mask.

These and other features of the present invention will be described in more detail below in the detailed description of the invention and in conjunction with the following figures.

BRIEF DESCRIPTION OF THE DRAWINGS

The present invention is illustrated by way of example, and not by way of limitation, in the figures of the accompanying drawings and in which like reference numerals refer to similar elements and in which.

DETAILED DESCRIPTION OF THE PREFERRED EMBODIMENTS

The present invention will now be described in detail with reference to a few preferred embodiments thereof as illustrated in the accompanying drawings. In the following description, numerous specific details are set forth in order to provide a thorough understanding of the present invention. It will be apparent, however, to one skilled in the art, that the present invention may be practiced without some or all of these specific details. In other instances, well known process steps and/or structures have not been described in detail in order to not unnecessarily obscure the present invention.

Figure 1:
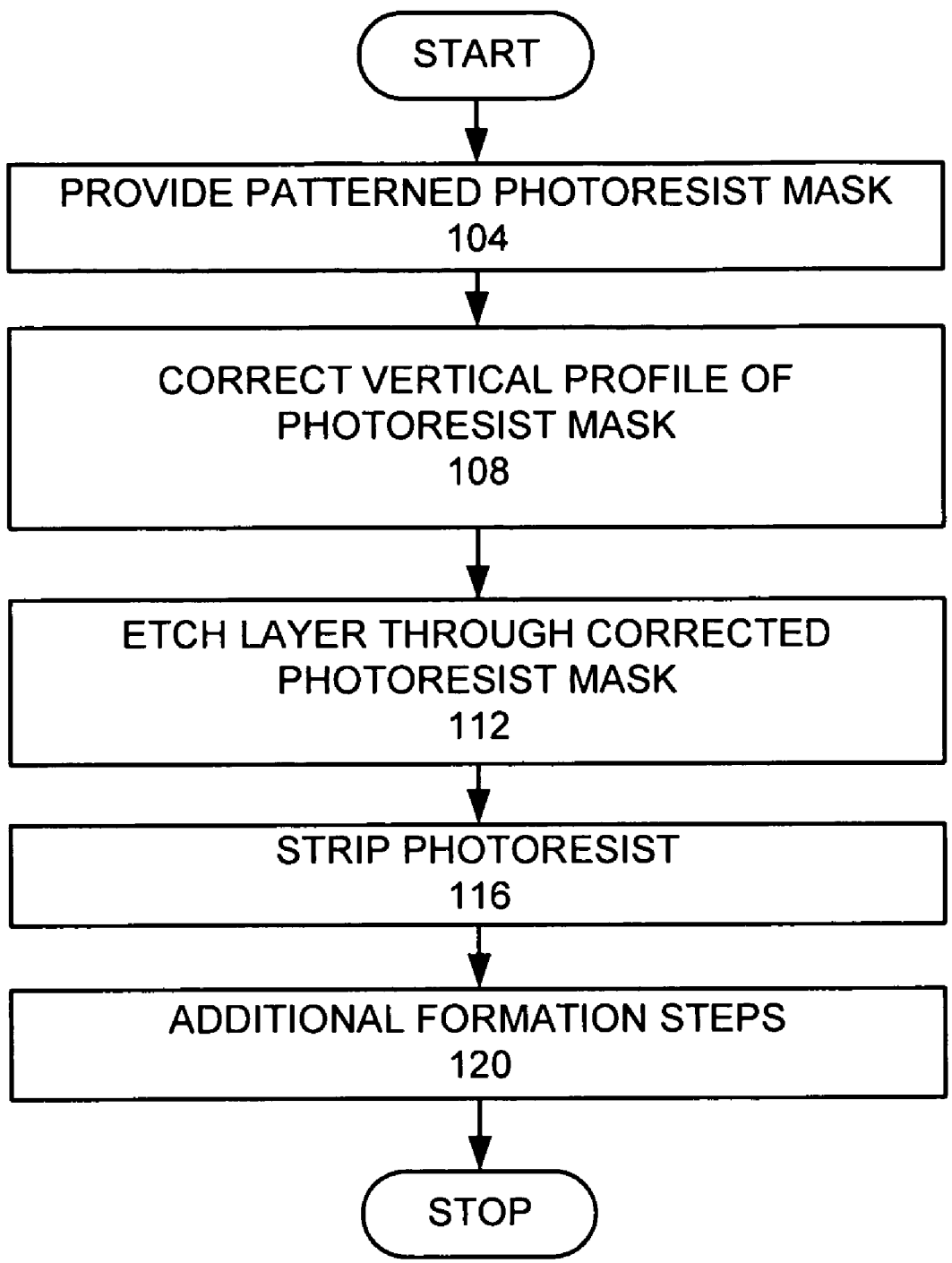
FIG. 1 is a high level flow chart of a process that may be used in an embodiment of the invention.
Figure 2A:
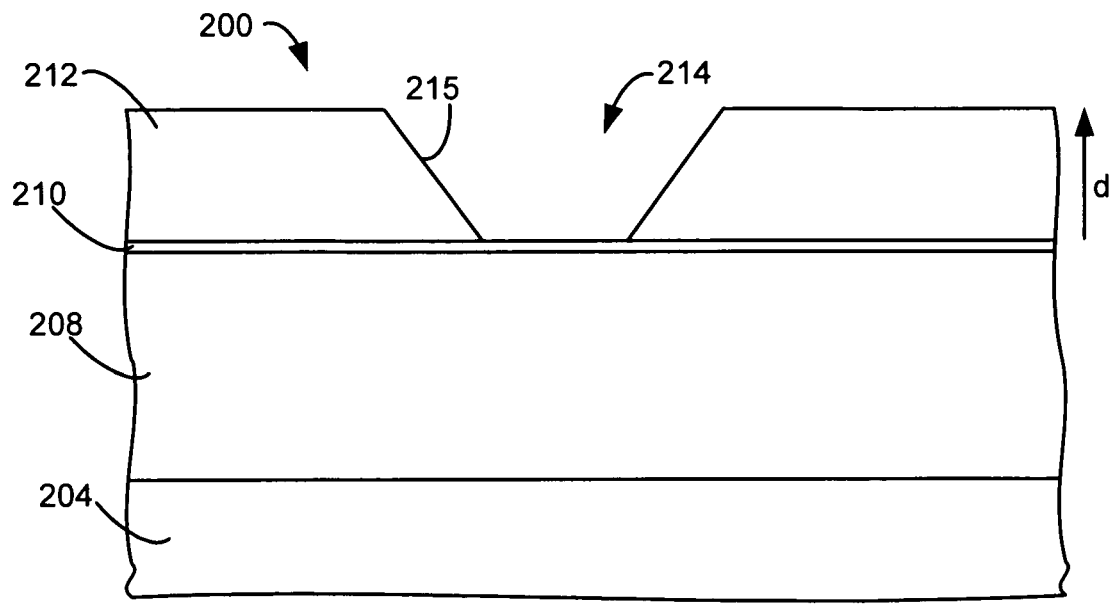
FIGS. 2A-D are schematic cross-sectional views of a stack processed according to an embodiment of the invention.

To facilitate understanding, FIG. 1 is a high level flow chart of a process that may be used in an embodiment of the invention. A patterned photoresist mask is provided (step 104). FIG. 2A is a schematic cross-sectional view of a layer to be etched 208 over a substrate 204, with a patterned photoresist mask 212 with a feature 214, over a ARL 210, over the etch layer 208 forming a stack 200. A photoresist layer has been patterned to form photoresist features with photoresist sidewalls. The patterning process may cause the sidewalls 213 of the photoresist features to have an irregular vertical profile. The photoresist feature irregular sidewall profile in the vertical direction shown in FIG. 2A is sloped. In the specification and claims, the vertical direction is defined as the direction along the depth "d" of the photoresist feature, as shown in FIG. 2A, as opposed to irregularities around the perimeter of the photoresist features, so that the photoresist features have non-vertical sidewall profiles. Therefore, the irregular profile along the vertical direction of the photoresist features is an irregular profile along the depth of the photoresist feature.

Figure 2B:
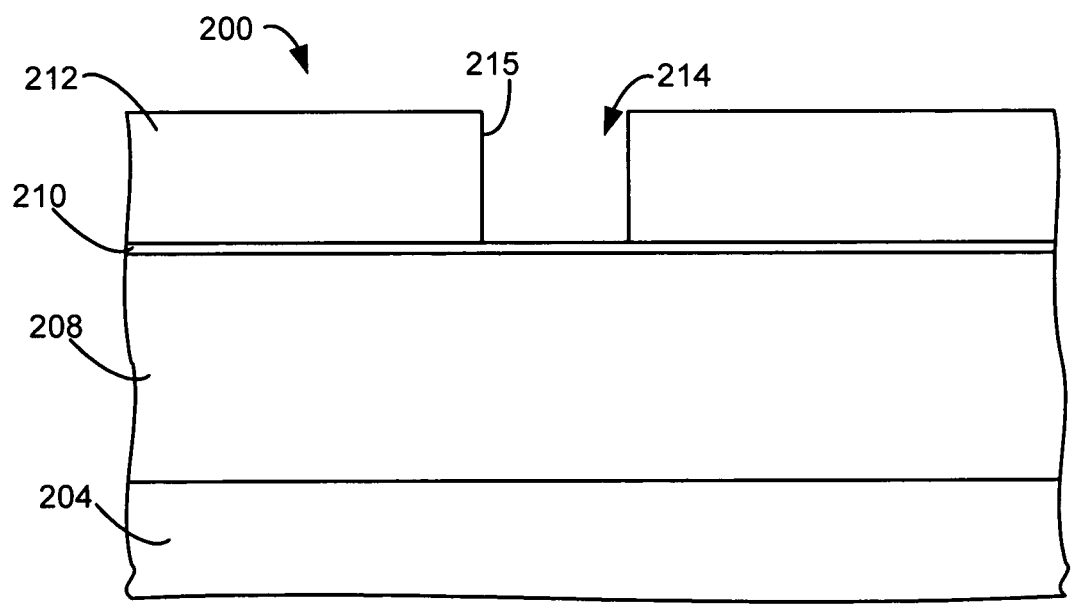
Figure 3:
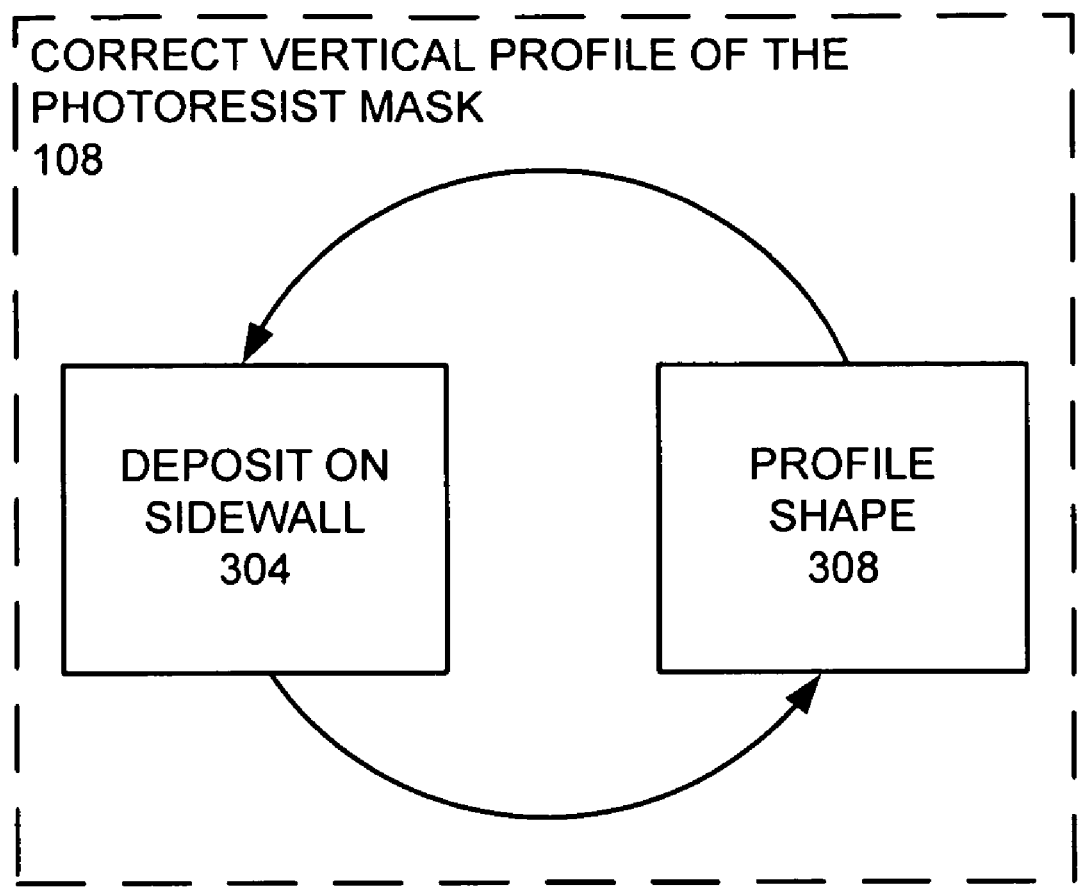
FIG. 3 is a more detailed flow chart of the step of correcting the vertical profile of the photoresist mask.

The irregular profile in the vertical direction of the photoresist feature is corrected (step 108). FIG. 2B is a schematic cross-sectional view of the patterned photoresist mask 212 where the sidewalls 215 of the photoresist features have a corrected profile in the vertical direction. FIG. 3 is a more detailed flow chart of the multistep process for correcting the profile in the vertical direction of the sidewalls of the photoresist features (step 108). In this example, the correction of the profile in the vertical direction of the sidewalls of the mask is performed in a two-phase cyclic process. One phase of the cyclic process is the deposition on the sidewalls (step 304) and the other phase is profile shaping. Additional phases may be added to each cycle. Preferably, this step is preformed over 1 to 20 cycles. More preferably, this step is performed over 2 to 10 cycles.

More preferably, the sidewall deposition phase (step 304) uses a deposition gas comprising at least one of a combination of $CF_4$ and $H_2$ or a combination of $CH_3F$ and $N_2$ or $C_xF_y$ or $C_xH_yF_z$ with an oxidizing or reducing additive such as hydrogen, nitrogen, or oxygen. More generally, the deposition gas comprises at least one of hydrocarbon, fluorocarbon, and hydrofluorocarbon. More preferably, the deposition gas further comprises a carrier gas, such as argon or xenon. More preferably, the deposition gas further comprises at least one of an oxidizing additive and a reducing additive, such as $O_2$, $H_2$, or $NH_3$. The profile shaping stage uses a profile shaping gas comprising at least one of $C_xF_y$ and $NF_3$ and $C_xH_yF_z$. More preferably, the profile shaping gas further comprises a carrier gas, such as argon or xenon. More preferably, the profile shaping gas further comprises at least one of an oxidizing additive and a reducing additive, such as $O_2$, $H_2$, or $NH_3$.

Figure 2C:
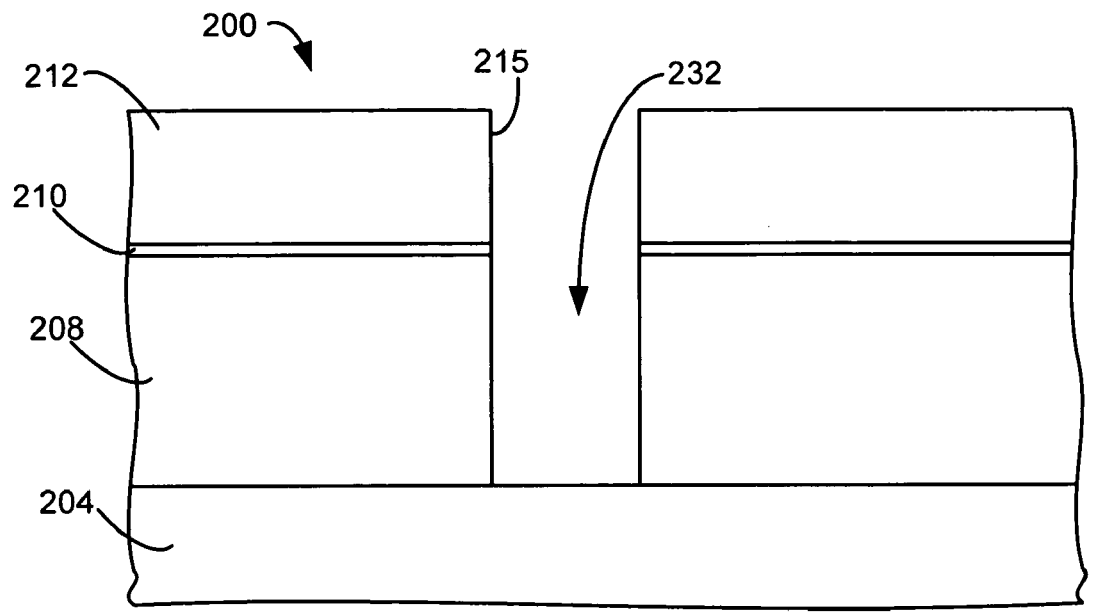

Features are then etched into the etch layer 208 through the corrected photoresist mask (step 112). FIG. 2C shows a feature 232 etched into the etch layer 208.

Figure 2D:
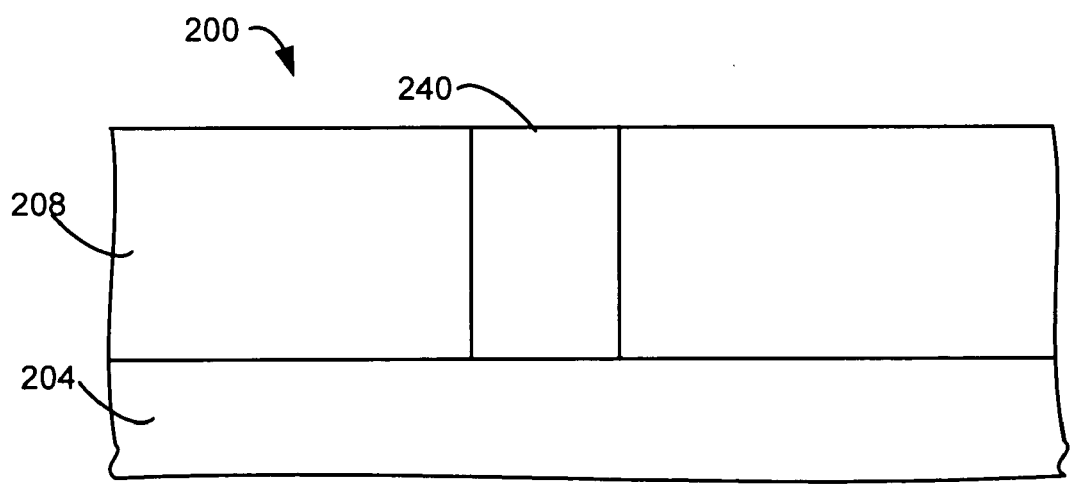

The photoresist is then be stripped (step 116). FIG. 2D shows the stack 200 after the photoresist mask has been removed. Additional formation steps may be performed (step 124). For example, a contact 240 may then be formed in the feature. To provide a dual damascene structure, a trench may be etched before the contact is formed. Additional processes may be performed after the contact is formed.

Example of Correction of Sloped Sidewalls

In an example, a multiple step process is used to form the hydrocarbon layer. The patterned photoresist layer is formed (step 104). In this example, the sidewalls 215 of the photoresist features 214 have an irregular shape in the vertical direction in that the sidewalls are sloped, as shown in FIG. 2A. The substrate 204, with the etch layer 208, an ARC layer 210, and a patterned photoresist mask 212 is placed in an etch chamber.

Figure 4:
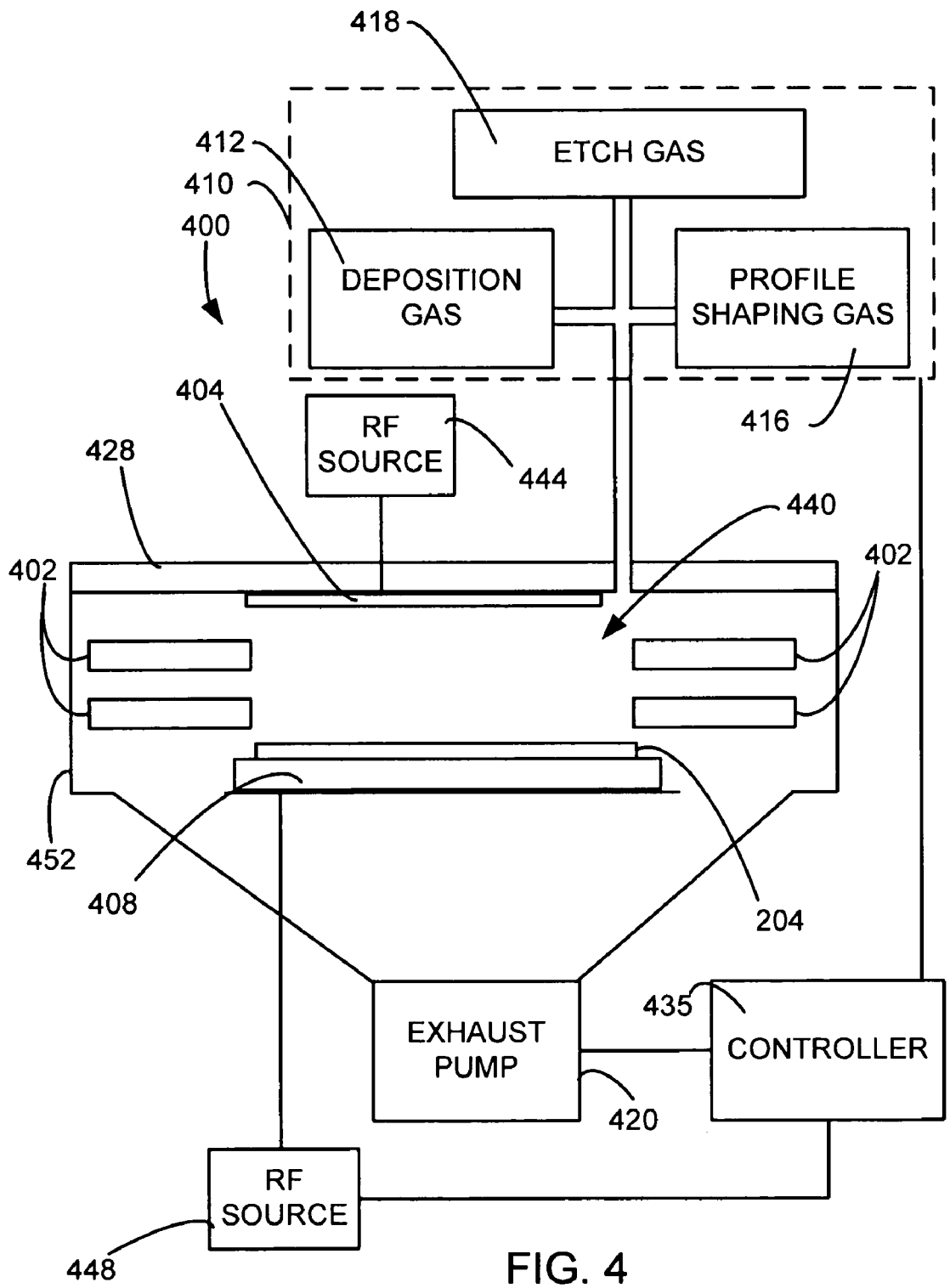
FIG. 4 is a schematic view of a plasma processing chamber that may be used in practicing the invention.

FIG. 4 is a schematic view of an processing chamber 400 that may be used for shaping the profile of the photoresist mask features in the vertical direction, etching, and stripping the photoresist mask. The plasma processing chamber 400 comprises confinement rings 402, an upper electrode 404, a lower electrode 408, a gas source 410 connected through a gas inlet, and an exhaust pump 420 connected to a gas outlet. The gas source 410 comprises a deposition gas source 412 and a profile shaping gas source 416. The gas source 410 may comprise additional gas sources, such as an etching gas source 418. Within plasma processing chamber 400, the substrate 204 is positioned upon the lower electrode 408. The lower electrode 408 incorporates a suitable substrate chucking mechanism (e.g., electrostatic, mechanical clamping, or the like) for holding the substrate 204. The reactor top 428 incorporates the upper electrode 404 disposed immediately opposite the lower electrode 408. The upper electrode 404, lower electrode 408, and confinement rings 402 define the confined plasma volume. Gas is supplied to the confined plasma volume by the gas source 410 and is exhausted from the confined plasma volume through the confinement rings 402 and an exhaust port by the exhaust pump 420. A first RF source 444 is electrically connected to the upper electrode 404. A second RF source 448 is electrically connected to the lower electrode 408. Chamber walls 452 surround the confinement rings 402, the upper electrode 404, and the lower electrode 408. Both the first RF source 444 and the second RF source 448 may comprise a 27 MHz power source and a 2 MHz power source. Different combinations of connecting RF power to the electrode are possible. In the case of Lam Research Corporation's Dual Frequency Capacitive (DFC) System, made by LAM Research Corporation™ of Fremont, Calif., which may be used in a preferred embodiment of the invention, both the 27 MHz and 2 MHz power sources make up the second RF power source 448 connected to the lower electrode, and the upper electrode is grounded. A controller 435 is controllably connected to the RF sources 444, 448, exhaust pump 420, and the gas source 410. The DFC System would be used when the layer to be etched 208 is a dielectric layer, such as silicon oxide or organo silicate glass.

Figure 5A:
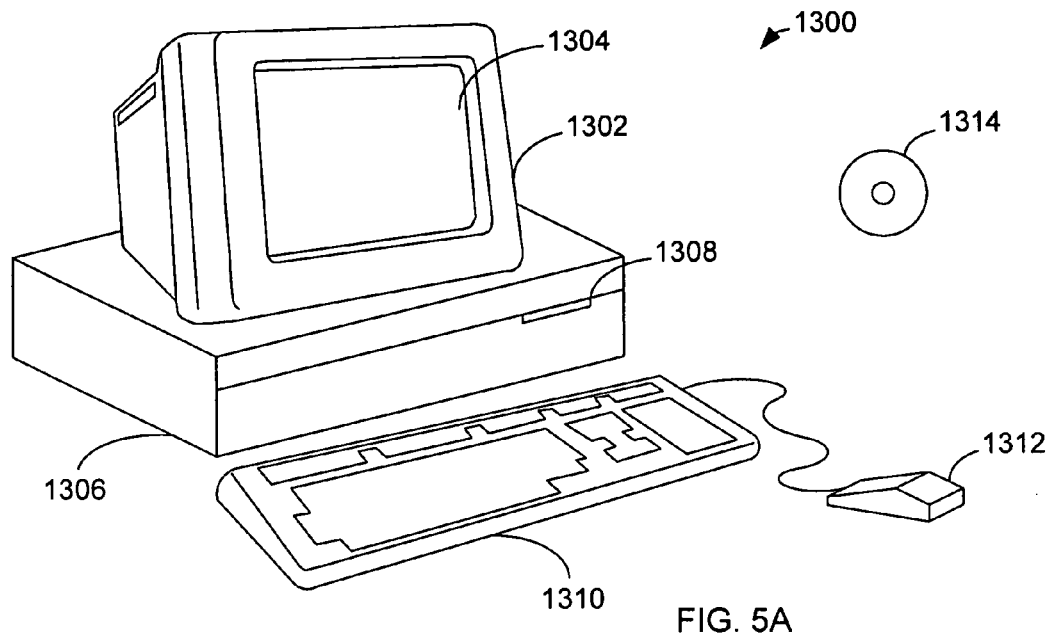
FIGS. 5A-B illustrate a computer system, which is suitable for implementing a controller used in embodiments of the present invention.
Figure 5B:
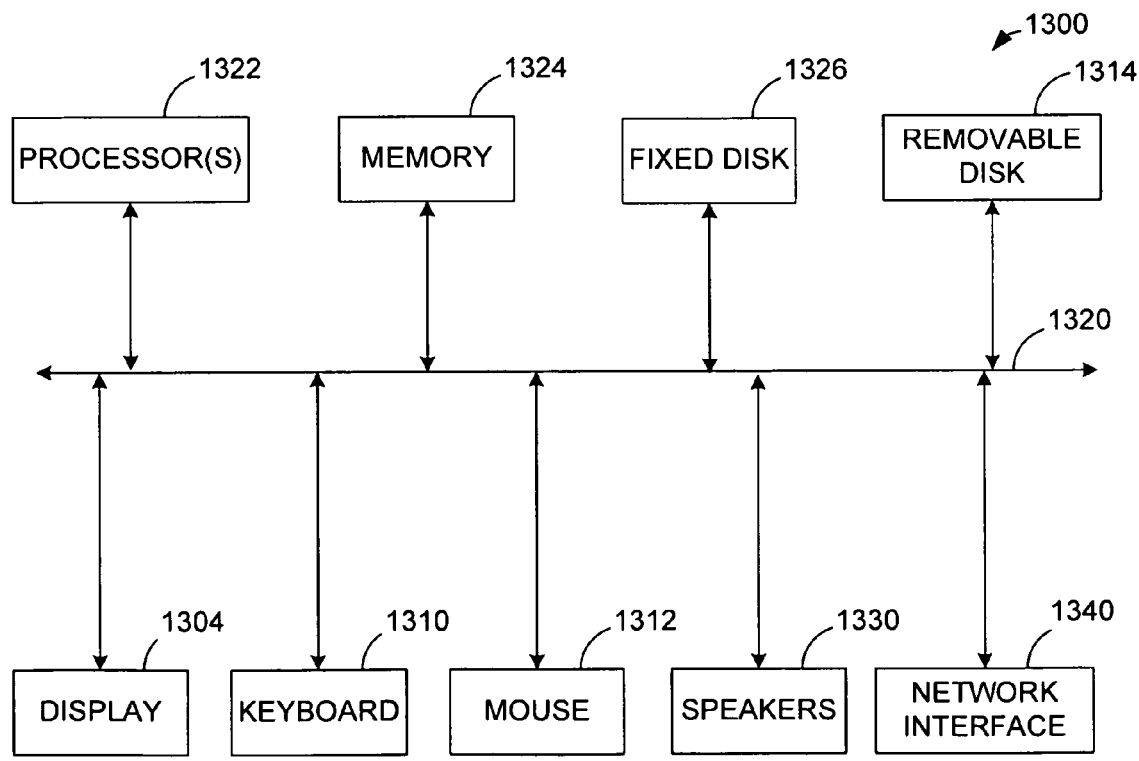

FIGS. 5A and 5B illustrate a computer system 1300, which is suitable for implementing a controller 435 used in embodiments of the present invention. FIG. 5A shows one possible physical form of the computer system. Of course, the computer system may have many physical forms ranging from an integrated circuit, a printed circuit board, and a small handheld device up to a huge super computer. Computer system 1300 includes a monitor 1302, a display 1304, a housing 1306, a disk drive 1308, a keyboard 1310, and a mouse 1312. Disk 1314 is a computer-readable medium used to transfer data to and from computer system 1300.

FIG. 5B is an example of a block diagram for computer system 1300. Attached to system bus 1320 is a wide variety of subsystems. Processor(s) 1322 (also referred to as central processing units, or CPUs) are coupled to storage devices, including memory 1324. Memory 1324 includes random access memory (RAM) and read-only memory (ROM). As is well known in the art, ROM acts to transfer data and instructions uni-directionally to the CPU and RAM is used typically to transfer data and instructions in a bi-directional manner. Both of these types of memories may include any suitable of the computer-readable media described below. A fixed disk 1326 is also coupled bi-directionally to CPU 1322; it provides additional data storage capacity and may also include any of the computer-readable media described below. Fixed disk 1326 may be used to store programs, data, and the like and is typically a secondary storage medium (such as a hard disk) that is slower than primary storage. It will be appreciated that the information retained within fixed disk 1326 may, in appropriate cases, be incorporated in standard fashion as virtual memory in memory 1324. Removable disk 1314 may take the form of any of the computer-readable media described below.

CPU 1322 is also coupled to a variety of input/output devices, such as display 1304, keyboard 1310, mouse 1312, and speakers 1330. In general, an input/output device may be any of: video displays, track balls, mice, keyboards, microphones, touch-sensitive displays, transducer card readers, magnetic or paper tape readers, tablets, styluses, voice or handwriting recognizers, biometrics readers, or other computers. CPU 1322 optionally may be coupled to another computer or telecommunications network using network interface 1340. With such a network interface, it is contemplated that the CPU might receive information from the network, or might output information to the network in the course of performing the above-described method steps. Furthermore, method embodiments of the present invention may execute solely upon CPU 1322 or may execute over a network such as the Internet in conjunction with a remote CPU that shares a portion of the processing.

In addition, embodiments of the present invention further relate to computer storage products with a computer-readable medium that have computer code thereon for performing various computer-implemented operations. The media and computer code may be those specially designed and constructed for the purposes of the present invention, or they may be of the kind well known and available to those having skill in the computer software arts. Examples of computer-readable media include, but are not limited to: magnetic media such as hard disks, floppy disks, and magnetic tape; optical media such as CD-ROMs and holographic devices; magneto-optical media such as floptical disks; and hardware devices that are specially configured to store and execute program code, such as application-specific integrated circuits (ASICs), programmable logic devices (PLDs) and ROM and RAM devices. Examples of computer code include machine code, such as produced by a compiler, and files containing higher level code that are executed by a computer using an interpreter. Computer readable media may also be computer code transmitted by a computer data signal embodied in a carrier wave and representing a sequence of instructions that are executable by a processor.

A multiple cycle multiple phase process is used to correct the vertical profile of the photoresist mask (step 108). An example of a deposition on the sidewall phase (step 304) provides a flow of 150 sccm $CH_3F$, 75 sccm $N_2$, and 100 sccm Ar. The pressure is set to 80 mTorr. The substrate is maintained at a temperature of 20° C. The second RF source 448 provides 400 Watts at a frequency of 27 MHz and 0 Watts a frequency of 2 MHz.

An example of the profile shaping phase (step 308) provides a halogen (i.e. fluorine, bromine, chlorine) containing gas, such as 100 sccm $CF_4$. In this example, $CF_4$ is the only gas provided during the profile shaping. A pressure of 20 mTorr is provided to the chamber. The second RF source 448 provides 600 Watts at a frequency of 27 MHz and 0 Watts a frequency of 2 MHz.

In other embodiments, each cycle may further include additional deposition and/or profile shaping phases.

Preferably, the vertical sidewalls of the corrected profile are sidewalls that from bottom to top make an angle between 88° to 90° with the bottom of the feature.

An example of a layer to be etched may be a conventional etch layer, such as SiN, SiC, an oxide, or low-k dielectric. A conventional etch recipe may be used to etch the layer to be etched.

To strip the photoresist and the sidewall layer (step 116) an oxygen ashing may be used.

If the irregular profile in the vertical direction was not corrected, a mask with sloped sidewalls can cause the resulting feature to have sloped sidewalls. The correction of the irregular profile in the vertical direction of the sidewalls provides features with vertical profiles.

Example of Retrograde Sidewalls

Figure 6A:
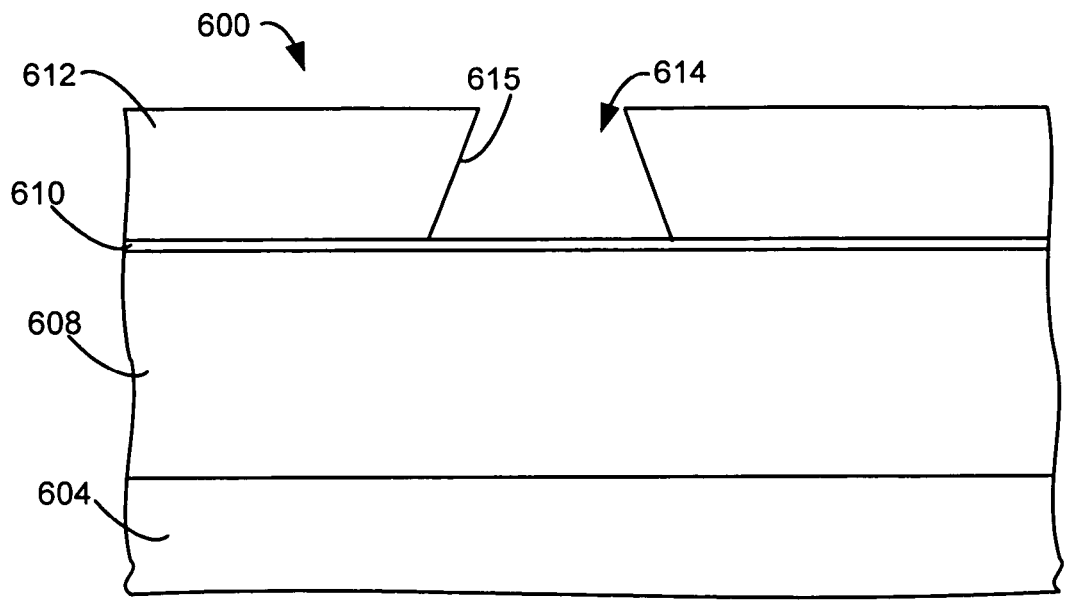
FIGS. 6A-C are schematic cross-sectional views of a stack processed according to an example of the invention.

In an example, the patterned photoresist mask 612 is formed (step 104) with photoresist features 614 with irregular profiles in the vertical directions, which are retrograde sidewalls 615, as shown in FIG. 6A. The photoresist mask 612 is disposed above an ARL 610, disposed above an etch layer 608, disposed above a substrate 604. The stack 600 is placed in an etch chamber, as shown in FIG. 4

Figure 6B:
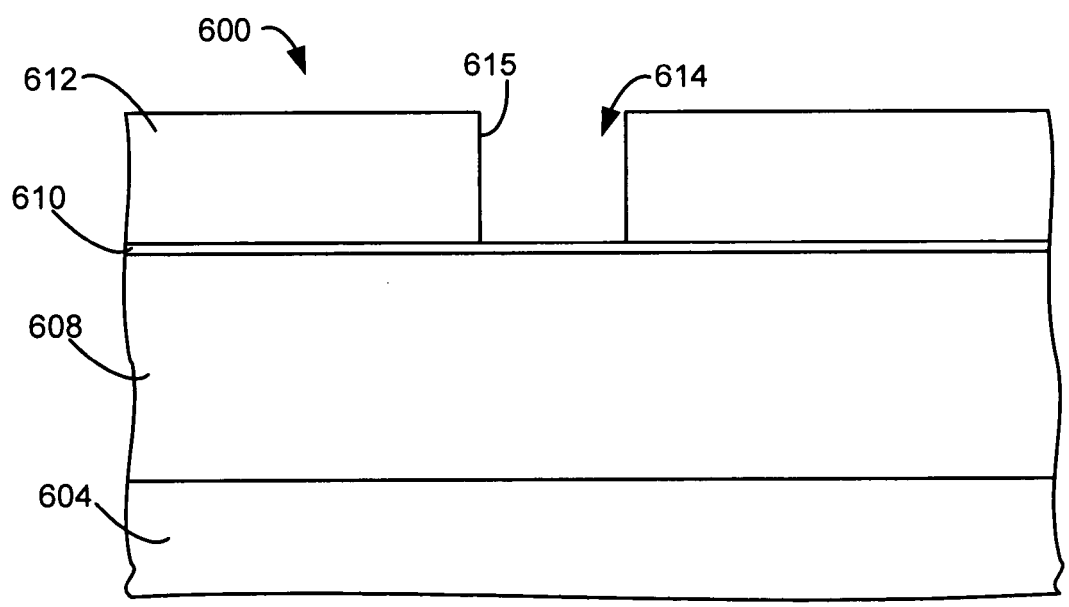

A multiple cycle multiple phase process is used to correct the profile in the vertical of the photoresist mask (step 108), as shown in FIG. 6B. For the deposition phase (step 304) a deposition recipe used in the previous example may be used. An example of the profile shaping phase (step 308) may use the recipe in the previous example. Changes in various parameters, such as the ratio of the deposition period of the deposition phase and the profile shaping period of the profile shaping phase may be used to correct the different irregularly shaped profiles in the vertical direction.

In other embodiments, each cycle may further include additional deposition and/or profile shaping phases.

Figure 6C:
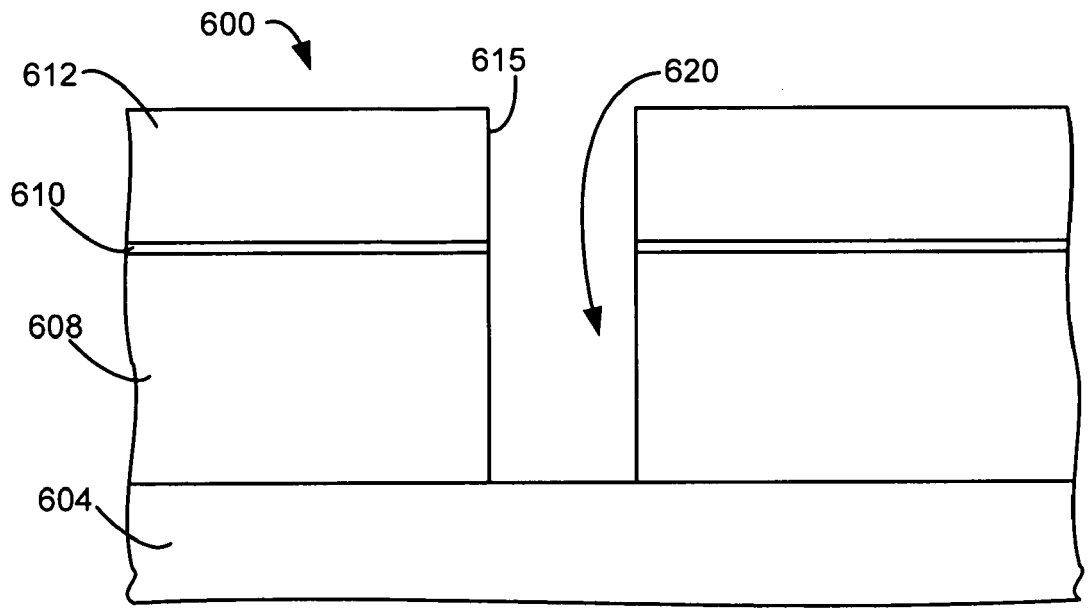

An example of a layer to be etched is may be a conventional etch layer, such as SiN, SiC, an oxide, or low-k dielectric. A conventional etch recipe may be used to etch features 620 into the etch layer 608, as shown in FIG. 6C.

To strip the photoresist and the sidewall layer (step 116) an oxygen ashing may be used.

If the profile was not corrected, a mask with retrograde sidewalls can cause the resulting feature to have sloped sidewalls. The correction of the vertical profile of the sidewalls provides features with vertical profiles.

Example of Standing Wave Sidewalls

Figure 7A:
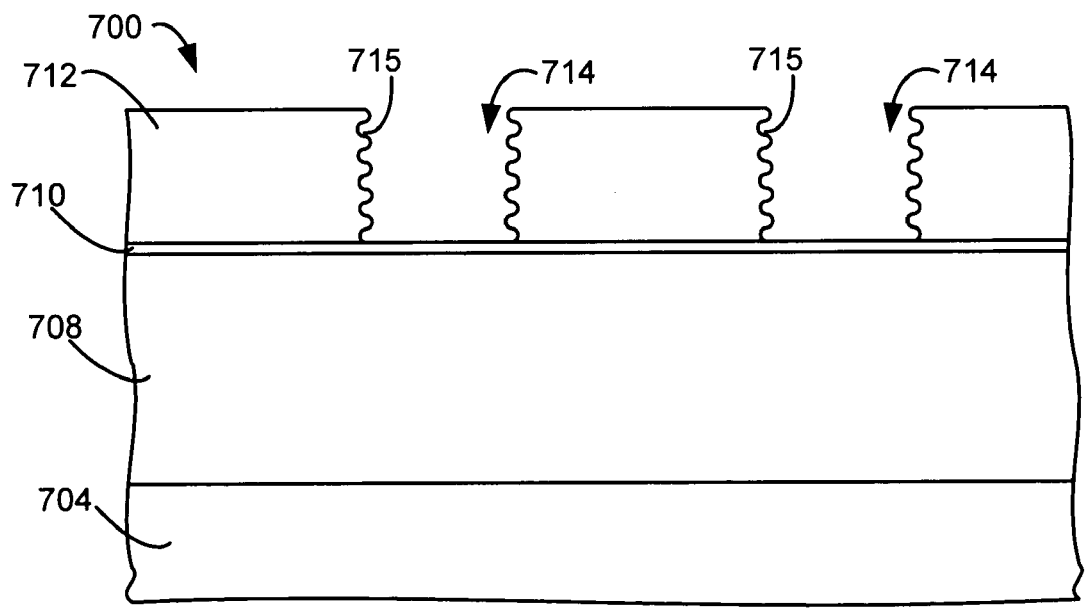
FIGS. 7A-C are schematic cross-sectional views of a stack processed according to another example of the invention.

In an example, the patterned photoresist mask 712 is formed (step 104) with photoresist features 714 with sidewalls 715 with standing wave deformations, as shown in FIG. 7A. Without wishing to be bound by theory, it is believed that the photoresist feature size creates standing optical waves. As a result, the sidewalls of the photoresist features are deformed according to the standing waves. The photoresist mask 712 is disposed above an ARL 710, disposed above an etch layer 708, disposed above a substrate 704. The stack 700 is placed in an etch chamber, as shown in FIG. 4

Figure 7B:
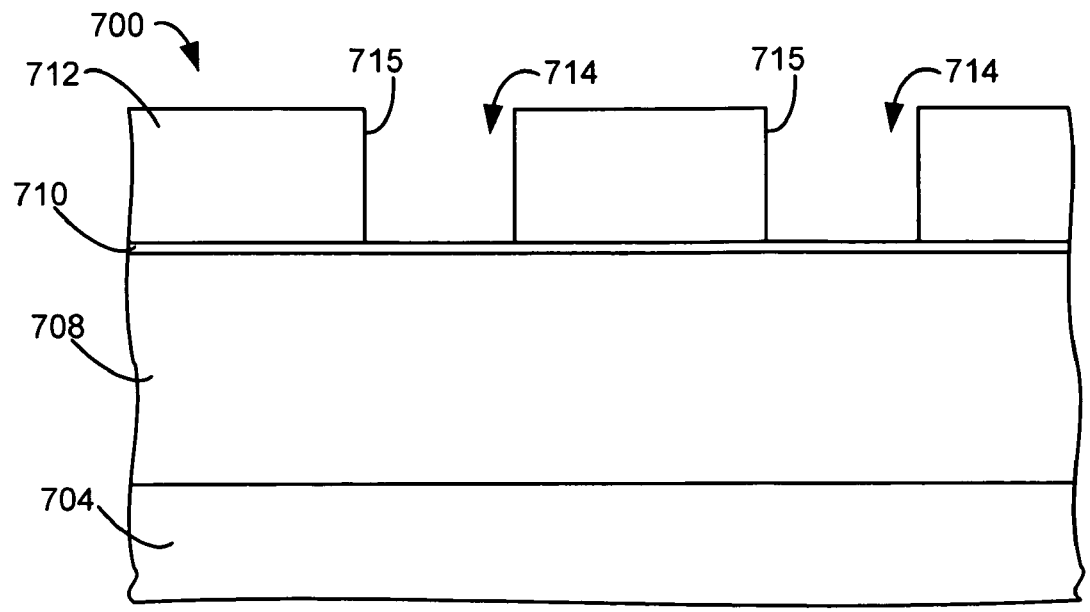

A multiple cycle multiple phase process is used to correct the profile in the vertical of the photoresist mask (step 108), as shown in FIG. 7B. For the deposition phase (step 304) a deposition recipe used in the previous example may be used. An example of the profile shaping phase (step 308) may use the recipe in the previous example. Changes in various parameters, such as the ratio of the deposition period of the deposition phase and the profile shaping period of the profile shaping phase may be used to correct the different irregularly shaped profiles in the vertical direction. Changes in various parameters, such as the ratio of the deposition period of the deposition phase and the profile shaping period of the profile shaping phase may be used to correct the different irregularly shaped profiles in the vertical direction.

In other embodiments, each cycle may further include additional deposition and/or profile shaping phases.

Figure 7C:
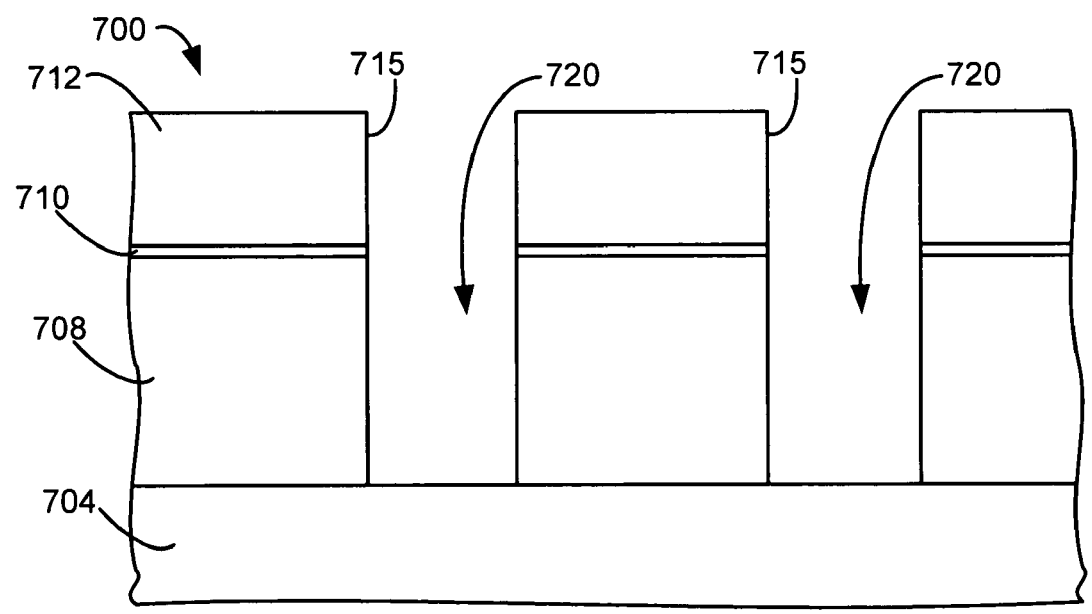

An example of a layer to be etched is may be a conventional etch layer, such as SiN, SiC, an oxide, or low-k dielectric. A conventional etch recipe may be used to etch features with vertical profile sidewalls 720 into the etch layer 708, as shown in FIG. 7C.

To strip the photoresist and the sidewall layer (step 116) an oxygen ashing may be used.

Example of Necked Sidewalls

Figure 8A:
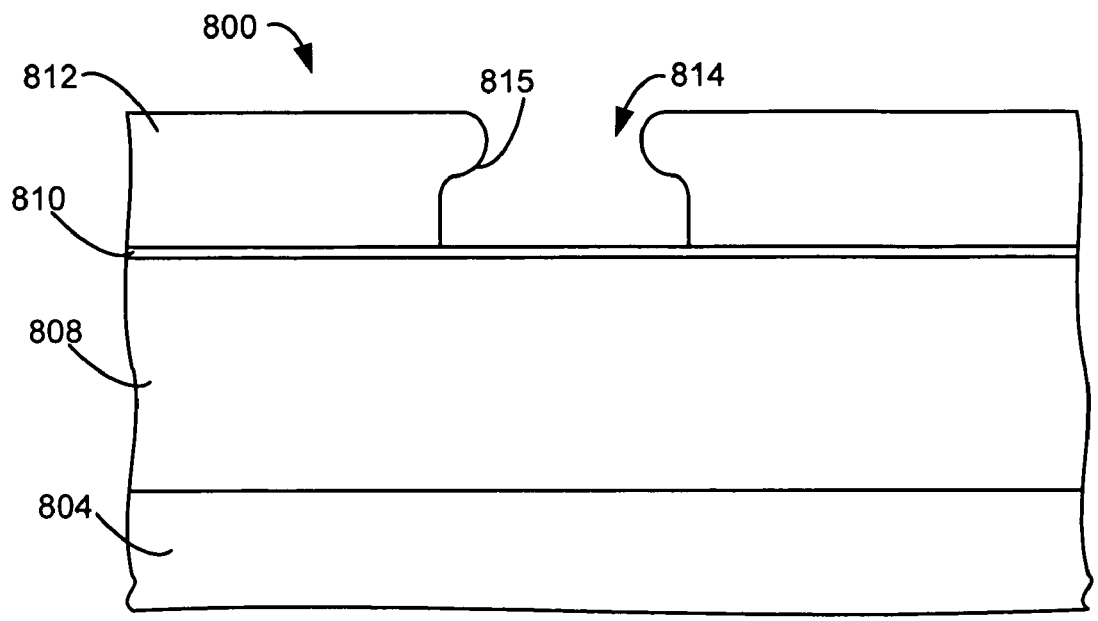
FIGS. 8A-B are schematic cross-sectional views of a stack processed according to another example of the invention.

In an example, the patterned photoresist mask 812 is formed (step 104) with photoresist features 814 with irregular profiles in the vertical directions, which are necked sidewalls 815, as shown in FIG. 8A. The photoresist mask 812 is disposed above an ARL 810, disposed above an etch layer 808, disposed above a substrate 804. The stack 800 is placed in an etch chamber, as shown in FIG. 4

Figure 8B:
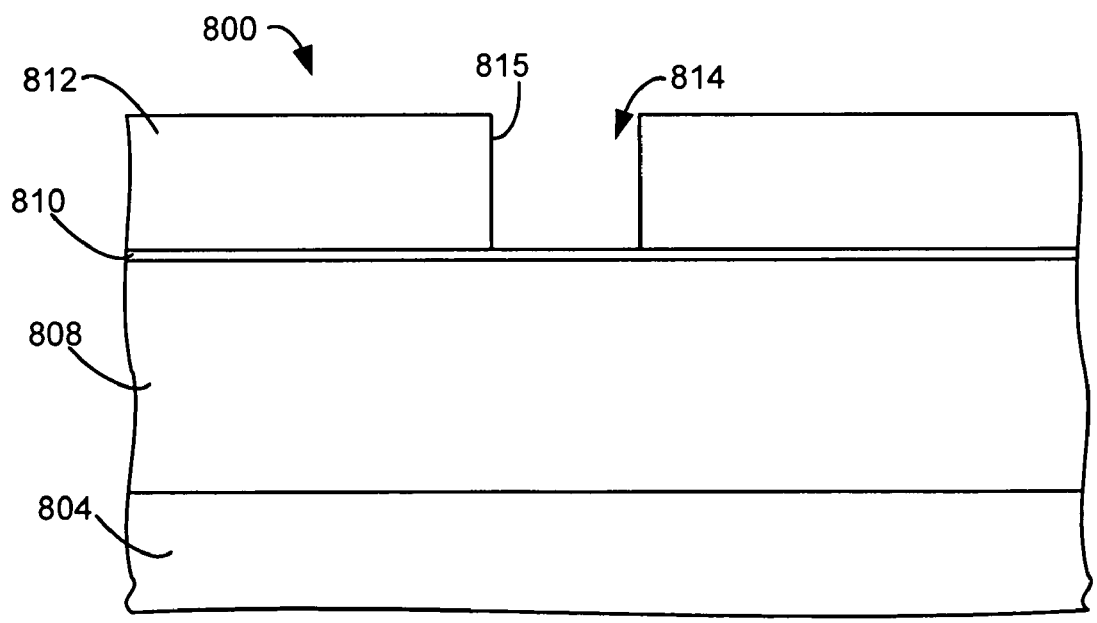

A multiple cycle multiple phase process is used to correct the profile in the vertical of the photoresist mask (step 108), as shown in FIG. 8B.

The invention corrects sidewalls of photoresist features with irregular profiles along the depth of the features such as at least one of sloped, retrograde, standing wave, and necked sidewalls. At least one of these irregularities includes combinations of these irregularities, such as a combination of a retrograde nearer to the bottom and necked sidewall near to the top that provide a bowed or wine glass shaped sidewall.

While this invention has been described in terms of several preferred embodiments, there are alterations, modifications, modifications, permutations, and various substitute equivalents, which fall within the scope of this invention. It should also be noted that there are many alternative ways of implementing the methods and apparatuses of the present invention. It is therefore intended that the following appended claims be interpreted as including all such alterations, modifications, permutations, and various substitute equivalents as fall within the true spirit and scope of the present invention.

What is claimed is:

1. A method for etching features in an etch layer, comprising:
   forming a patterned photoresist mask over the etch layer with photoresist features with sidewalls wherein the sidewalls of the photoresist features have irregular profiles along depths of the photoresist features;
   correcting the irregular profiles along the depths of the photoresist features of the sidewalls of the photoresist features comprising at least one cycle, wherein each cycle comprises:
      a sidewall deposition phase; and
      a profile shaping phase, wherein the profile shaping phase is performed after the sidewall deposition phase;
   etching features into the etch layer through the photoresist features, after the correcting the irregular profiles is completed; and
   removing the mask.

2. The method, as recited in claim 1, wherein the irregular profiles are at least one of slopping sidewalls, necking sidewalls, retrograde sidewalls, and standing wave deformed sidewalls.

3. The method, as recited in claim 2, wherein the sidewall deposition phase comprises:
   providing a deposition gas comprising at least one of a hydrocarbon, fluorocarbon, and hydrofluorocarbon;
   forming a plasma from the deposition gas; and
   stopping the flow of the deposition gas.

4. The method, as recited in claim 3, wherein the profile shaping phase comprises:
   providing a profile shaping gas comprising at least one of $C_xF_y$, $NF_3$, and $C_xH_yF_z$;
   forming a plasma from the profile shaping gas; and
   stopping the flow of the profile shaping gas.

5. The method, as recited in claim 4, wherein the correcting the irregular profiles along the depths of the photoresist features transforms the sidewalls of the photoresist features to vertical profile sidewalls.

6. The method, as recited in claim 5, wherein the vertical profile sidewalls are sidewalls that from bottom to top make an angle between 88° to 90° with bottoms of the photoresist features.

7. The method, as recited in claim 6, wherein the deposition gas further comprises at least one of an oxidizing additive and a reducing additive.

8. The method, as recited in claim 7, wherein the deposition gas further comprises a carrier gas.

9. The method, as recited in claim 8, wherein the profile shaping gas further comprises at least one of an oxidizing additive and a reducing additive.

10. The method, as recited in claim 9, wherein the profile shaping gas further comprises a carrier gas.

11. The method, as recited in claim 1, wherein the sidewall deposition phase comprises:
    providing a deposition gas comprises at least one of a hydrocarbon, fluorocarbon, and hydrofluorocarbon;
    forming a plasma from the deposition gas; and
    stopping the flow of the deposition gas.

12. The method, as recited in claim 1, wherein the correcting the irregular profiles along the depths of the photoresist features transforms the sidewalls of the photoresist features to vertical profile sidewalls.

13. The method, as recited in claim 12, wherein the vertical profile sidewalls are sidewalls that from bottom to top make an angle between 88° to 90° with bottoms of the photoresist features.

14. The method, as recited in claim 1 wherein the correcting the irregular profiles comprises a plurality of cycles.

15. A method for etching features with vertical profile sidewalls in an etch layer, comprising:
    forming a patterned photoresist mask over the etch layer with photoresist features with sidewalls wherein the sidewalls of the photoresist features have non-vertical profile sidewalls;
    correcting the non-vertical profile sidewalls to form photoresist features with vertical profile sidewalls comprising a plurality of cycles, wherein each cycle comprises:
       a sidewall deposition phase; and
       a profile shaping phase, after the sidewall deposition phase is completed;
    etching features with vertical profile sidewalls into the etch layer through the photoresist features, after the correcting the non-vertical profiles is completed; and
    removing the mask.

16. The method, as recited in claim 15, wherein the sidewall deposition phase comprises:
    providing a deposition gas comprises at least one of a hydrocarbon, fluorocarbon and hydrofluorocarbon and at least one of an oxidizing additive and a reducing additive;
    forming a plasma from the deposition gas; and
    stopping the flow of the deposition gas.

17. The method, as recited in claim 16, wherein the profile shaping phase comprises:
    providing a profile shaping gas comprising at least one of $C_xF_y$, $NF_3$, and $C_xH_yF_z$ and at least one of an oxidizing additive and a reducing additive;
    forming a plasma from the profile shaping gas; and
    stopping the flow of the profile shaping gas.

18. The method, as recited in claim 17, wherein the correcting the non-vertical profiles along the depths of the photoresist features transforms the sidewalls of the photoresist features to vertical profile sidewalls.

19. The method, as recited in claim 1, wherein the sidewall deposition phase and profile shaping phase provide a nonconformal deposition.

20. The method, as recited in claim 1, wherein the correcting the irregular profiles provides vertical sidewalls from non-vertical profiles.

* * * * *